(12) United States Patent
Lubomirsky et al.

(10) Patent No.: US 6,742,279 B2
(45) Date of Patent: Jun. 1, 2004

(54) APPARATUS AND METHOD FOR RINSING SUBSTRATES

(75) Inventors: Dmitry Lubomirsky, Cupertino, CA (US); Joseph J. Stevens, San Jose, CA (US)

(73) Assignee: Applied Materials Inc., Santa Clara, CA (US)

(*) Notice: Subject to any disclaimer, the term of this patent is extended or adjusted under 35 U.S.C. 154(b) by 0 days.

(21) Appl. No.: 10/052,015

(22) Filed: Jan. 16, 2002

(65) Prior Publication Data

US 2003/0131494 A1 Jul. 17, 2003

(51) Int. Cl.[7] .................................................. F26B 5/08
(52) U.S. Cl. ............................. 34/317; 34/58; 34/318; 134/33; 134/149; 134/902
(58) Field of Search ............................ 34/317, 314, 318, 34/319, 58; 134/902, 33, 149

(56) References Cited

U.S. PATENT DOCUMENTS

| | | | |
|---|---|---|---|
| 4,021,278 A | 5/1977 | Hood et al. .................. 156/626 |
| 4,510,176 A | 4/1985 | Cuthbert et al. .............. 427/82 |
| 4,519,846 A | 5/1985 | Aigo ........................... 134/15 |
| 4,544,446 A | 10/1985 | Cady | |
| 4,651,440 A | * 3/1987 | Karl ............................. 34/58 |
| 4,677,758 A | 7/1987 | Aigo ............................ 34/58 |
| 4,677,759 A | * 7/1987 | Inamura ....................... 34/58 |
| 4,724,619 A | * 2/1988 | Poli et al. ...................... 34/58 |
| 4,875,434 A | 10/1989 | Maejima et al. .............. 118/52 |
| 4,989,345 A | 2/1991 | Gill, Jr. ......................... 34/58 |
| 5,232,511 A | 8/1993 | Bergman ....................... 134/2 |
| 5,395,649 A | 3/1995 | Ikeda ........................... 427/240 |
| 5,435,075 A | * 7/1995 | Shiraishi et al. ............... 34/58 |
| 5,873,177 A | 2/1999 | Honda et al. .................. 34/58 |
| 5,899,216 A | 5/1999 | Goudie et al. ................. 134/61 |
| 5,974,661 A | 11/1999 | Neuhalfen .................... 29/825 |
| 5,979,475 A | 11/1999 | Satoh et al. ................. 134/140 |
| 6,029,369 A | 2/2000 | Gonzalez-Martin et al. .. 34/317 |
| 6,099,702 A | 8/2000 | Reid et al. .................... 204/212 |
| 6,179,982 B1 | 1/2001 | Ting et al. ..................... 208/80 |
| 6,214,193 B1 | 4/2001 | Reid et al. .................... 205/122 |
| 6,267,853 B1 | 7/2001 | Dordi et al. ................. 204/232 |
| 6,273,104 B1 | 8/2001 | Shinbara et al. ........... 134/25.4 |
| 6,290,865 B1 | 9/2001 | Lloyd et al. ................... 216/92 |
| 6,405,739 B1 | * 6/2002 | Liu ............................. 134/149 |

* cited by examiner

Primary Examiner—Ira S. Lazarus
Assistant Examiner—Kathryn S. O'Malley
(74) Attorney, Agent, or Firm—Thomason, Moser & Patterson

(57) ABSTRACT

Embodiments of the invention provide a spin rinse dry (SRD) chamber for a semiconductor processing system. The SRD chamber includes a selectively rotatable substrate support member having an upper substrate receiving surface formed thereon, and a selectively rotatable shield member positioned above the upper substrate receiving surface, the rotatable shield member having a substantially planar lower surface that may be selectively positioned proximate the upper substrate. Embodiments of the invention further provide a method for rinsing semiconductor substrates, including the steps of positioning the substrate on a substrate support member, positioning a shield member having a substantially planar lower surface in a processing position above the substrate such that the substantially planar lower surface is in parallel orientation with an upper surface of the substrate, and flowing a fluid solution into a processing region defined by the upper surface of the substrate and the substantially planar lower surface via a fluid aperture in the substantially planar lower surface.

41 Claims, 4 Drawing Sheets

APPARATUS AND METHOD FOR RINSING SUBSTRATES

BACKGROUND OF THE INVENTION

1. Field of the Invention

The present invention generally relates to semiconductor plating and other wet processing systems.

2. Description of the Related Art

Sub-quarter micron multilevel metallization is a key technology for the next generation of very large scale integration (VLSI) and ultra large scale integration (ULSI). The multilevel interconnects that lie at the heart of these integration technologies generally possess high aspect ratio features, including contacts, vias, lines, plugs, and other features. Therefore, reliable formation of these features is critical to the success of VLSI and ULSI, as well as to the continued effort to increase integrated circuit density, quality, and reliability on individual substrates. As such, there is a substantial amount of ongoing effort being directed to improving the formation of void-free sub-quarter micron features having high aspect ratios, i.e., features having a height to width ratio of about 4:1 or greater.

Elemental aluminum (Al) and aluminum alloys have conventionally been used as conductive materials to form lines, plugs, and other features in integrated circuit semiconductor processing techniques, as a result of aluminum's low resistivity, superior adhesion to silicon dioxide ($SiO_2$) substrates, ease of patterning, desirable electromigration characteristics, and relatively high purity available at moderate costs. However, as circuit densities increase and the size of conductive features therein decreases, conductive materials having a lower resistivity than aluminum may be desirable. Therefore, copper and copper alloys are becoming choice metals for filling sub-quarter micron and smaller high aspect ratio interconnect features in integrated circuits, as copper and copper alloys have a lower resistivity than aluminum, and therefore, generate better resistance/capacitance time delay characteristics. Additionally, copper and copper alloys generally offer improved electromigration characteristics over aluminum.

However, a challenge with using copper in integrated circuit fabrication is that copper is not easily deposited into high aspect ratio features with conventional semiconductor processing techniques. For example, physical vapor deposition (PVD) techniques may be used to deposit copper, however, PVD copper deposition is known to encounter difficulty in obtaining adequate bottom fill in high aspect ratio features. Additionally, chemical vapor deposition (CVD) may be used to deposit copper, however, CVD suffers from relatively low deposition rates, and therefore low throughput, in addition to using precursors that are difficult to manage. Additionally, copper is difficult to pattern with conventional semiconductor processing techniques, and therefore, copper must generally be deposited directly into features, where conventional aluminum deposition techniques allowed for deposition and patterning of the conductive features. In view of these difficulties, electroless and electroplating deposition methods have become an attractive option for depositing metal, specifically copper, onto semiconductor substrates and into high aspect ratio features.

Electroless and electroplating methods generally include a substrate plating step followed by a substrate rinse and dry step. The plating step generally includes flowing a plating solution over the surface of the substrate in order to deposit a desired metal layer on the surface of the substrate. Once the desired metal layer is formed on the substrate surface, the substrate surface is generally rinsed and dried to remove any excess material or plating solution therefrom. The rinsing process generally includes flowing a rinsing fluid onto the surface of the substrate while the substrate is rotated on a support member. The rinsing fluid is urged radially outward by the rotation of the substrate, and therefore, the rinsing fluid operates to sweep away or rinse off any excess material or plating solution on the substrate surface. Once the rinsing process is complete, the substrate is generally rotated at a high rate of speed in order to remove any excess rinsing solution from the surface of the substrate. However, conventional spin rinse dry (SRD) apparatuses and methods generally do not provide fluid management capability, i.e., conventional apparatuses generally flow rinsing fluids across the surface of the substrate and then discard the fluid as waste. Further, conventional SRDs generally offer no control over the fluid dynamics as the fluid passes over the substrate surface.

Therefore, there exists a need for a method and apparatus for cleaning and/or rinsing substrates in a semiconductor processing system, wherein the method and apparatus includes the ability to control fluid dynamics and to minimize fluid waste.

SUMMARY OF THE INVENTION

Embodiments of the invention generally provide an apparatus and method for rinsing and drying a substrate. One embodiment of the invention provides a spin rinse dry chamber for a semiconductor processing system. The SRD chamber includes a processing enclosure having a selectively rotatable substrate support member positioned therein. The substrate support member includes an upper substrate receiving surface formed thereon. The SRD chamber further includes a selectively rotatable shield member positioned above the upper substrate receiving surface within the SRD chamber. The rotatable shield member generally includes a substantially planar lower surface that may be selectively positioned proximate the upper surface of the substrate.

Embodiments of the invention further provide a semiconductor processing apparatus having a substrate support member positioned within a processing enclosure, the substrate support member having an upper substrate receiving surface formed thereon. The processing enclosure further includes a disk shaped shield member positioned therein above the substrate receiving surface. The disk shaped shield member generally includes a substantially planar lower surface positioned in a substantially parallel orientation with the upper substrate receiving surface.

Embodiments of the invention further provide a method for rinsing semiconductor substrates, including the steps of positioning the substrate on a substrate support member, and positioning a shield member having a substantially planar lower surface in a processing position above the substrate such that the substantially planar lower surface is in parallel orientation with an upper surface of the substrate. The method further includes flowing a fluid solution into a minimized processing volume defined by the upper surface of the substrate and the substantially planar lower surface. The fluid may be communicated to the processing volume via a fluid aperture formed into the substantially planar lower surface.

BRIEF DESCRIPTION OF THE DRAWINGS

So that the manner in which the above recited features of the present invention are attained and can be understood in detail, a more particular description of the invention briefly summarized above may be had by reference to the embodiments thereof, which are illustrated in the appended drawings. It is to be noted, however, that the appended drawings illustrate only typical or exemplary embodiments of the invention, and are therefore, not to be considered limiting of its scope, for the invention may admit to other equally effective embodiments.

DETAILED DESCRIPTION OF THE PREFERRED EMBODIMENT

Figure 1:
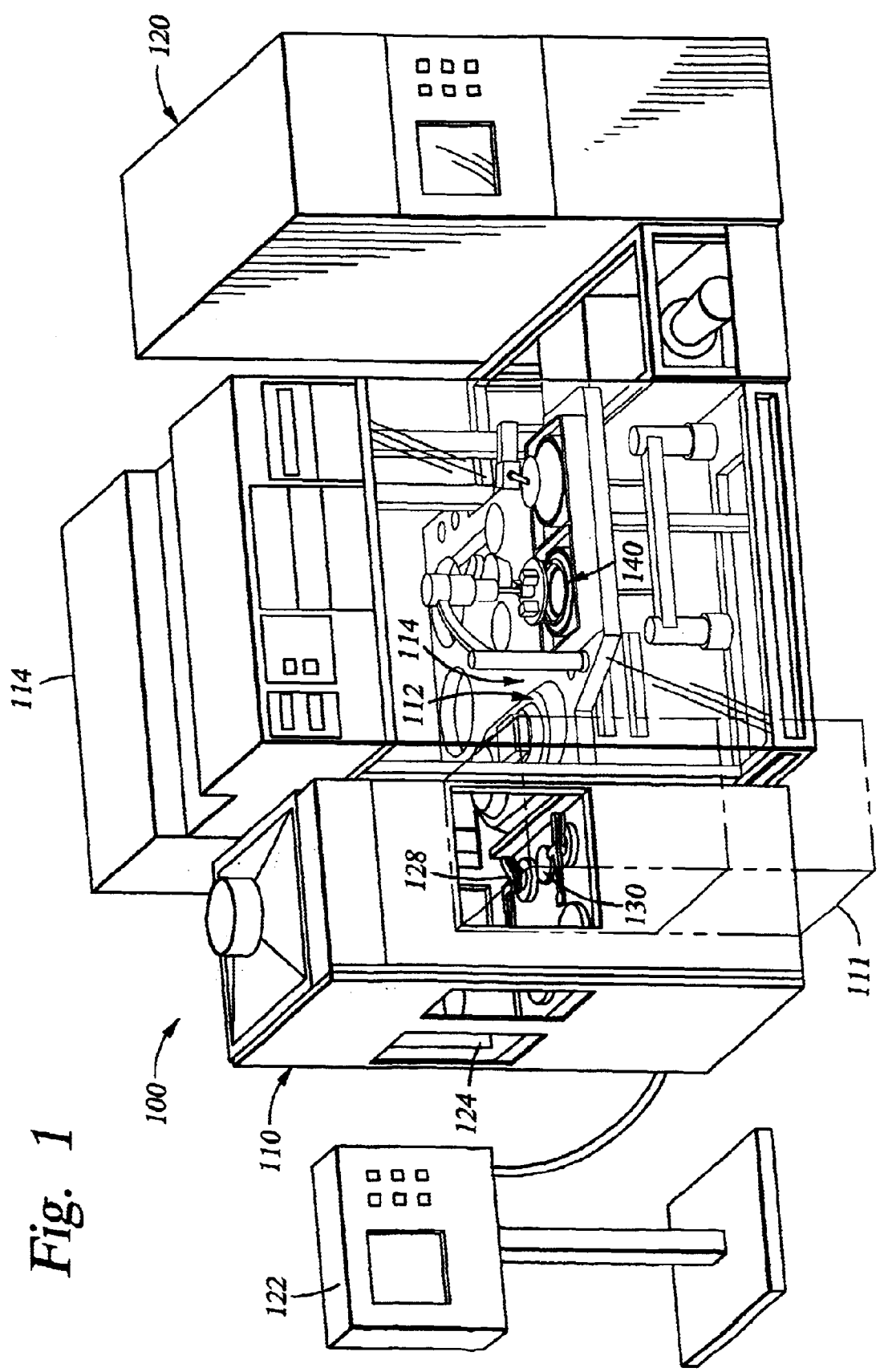
FIG. 1 illustrates a perspective view of an exemplary plating system of the invention.
Figure 2:
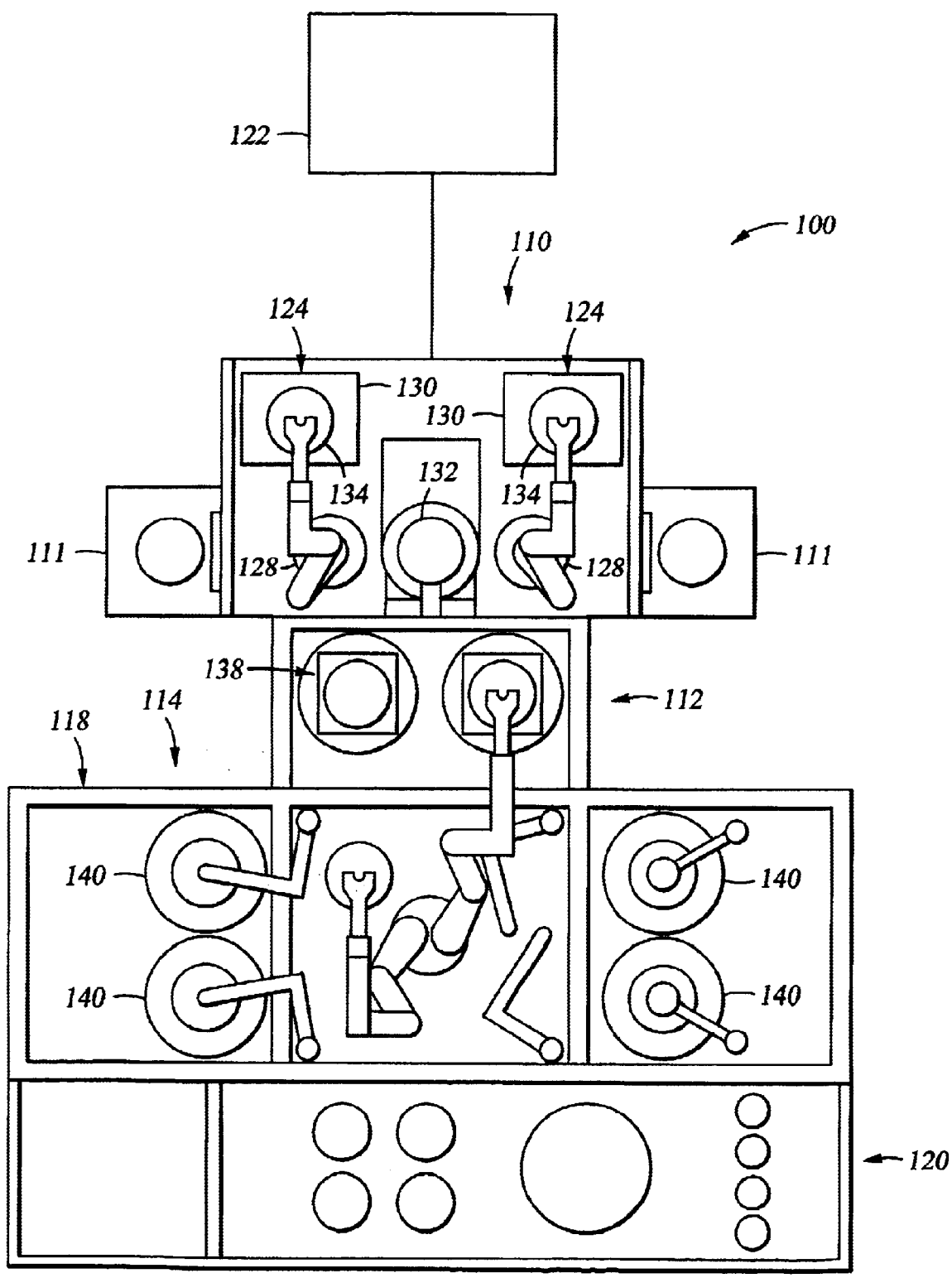
FIG. 2 illustrates a plan view of the exemplary plating system illustrated in FIG. 1.

Embodiments of the invention generally provide a semiconductor plating system configured to plate metals onto semiconductor substrates having high aspect ratio features formed thereon. FIG. 1 illustrates a perspective view of an exemplary plating system 100 of the invention. FIG. 2 illustrates a plan view of the exemplary plating system 100 of the invention. As cooperatively illustrated in FIGS. 1 and 2, system platform 100 generally includes a loading station 110, a thermal anneal chamber 111, a spin-rinse-dry (SRD) station 112, a mainframe 114, and an electrolyte replenishing system 120. Preferably, the system platform 100 is enclosed in a clean room-type environment using, for example, plexiglass panels to separate the clean room environment from the ambient atmosphere. The mainframe 114 generally includes a mainframe transfer station 116 and a plurality of processing stations 118. Each processing station 118 may include one or more processing cells 140. A fluid replenishing system 120 is generally positioned adjacent the electroplating system platform 100 and individually in fluid communication with process cells 140 in order to circulate processing fluids to cells 140. The system platform 100 also generally includes a control system 122, which may be a programmable microprocessor-type control system configured to interface with the various components of the system platform 100 and provide controlling signals thereto. Control system 122 may generally operate to control the cooperative operation of each of the components that together form electroplating system platform 100.

The loading station 110 generally includes one or more substrate cassette receiving areas 124, generally termed pod loaders, one or more loading station transfer robots 128, and at least one substrate orientor 130. The number of substrate cassette receiving areas 124, loading station transfer robots 128, and substrate orientors 130 included in the loading station 110 may be configured according to the desired throughput of the system. As shown for the embodiment illustrated in FIGS. 1 and 2, the loading station 110 includes two substrate cassette receiving areas 124, two loading station transfer robots 128, and one substrate orientor 130. A substrate cassette 132 containing substrates 134 is loaded onto the substrate cassette receiving area 124 in order to introduce substrates 134 into the electroplating system platform. The loading station transfer robot 128 transfers substrates 134 between the substrate cassette 132 and the substrate orientor 130. The loading station transfer robot 128 generally includes a substrate transfer robot, as is generally known in the art. The substrate orientor 130 positions each substrate 134 in a desired orientation to ensure that the substrate is properly processed. The loading station transfer robot 128 also transfers substrates 134 between the loading station 110 and the SRD station 112, and between the loading station 110 and the thermal anneal chamber 111, for example.

System 100 may generally be configured to process/plate substrates in a unitary apparatus/system, i.e., substrates to be plated are input into system 100, and plated substrates are output without transferring the substrates to another processing chamber/system. Therefore, system 100 offers an integrated processing system capable of activating a substrate for plating (assuming that an electroless plating process is used), rinsing a substrate before plating, plating a substrate, spin rinse drying a substrate, and annealing a substrate, all in a unitary processing system. The unitary/integrated processing system 100 allows for reduced contamination, reduced defect ratios, and increased throughput over conventional plating systems. Furthermore, as a result of the integrated/unitary configuration, system 100 uses a substantially smaller footprint than conventional plating systems. This is also a significant advantage, as a reduced footprint yields a reduction in the clean room space required to support system 100, which reduces operating costs.

Figure 3:
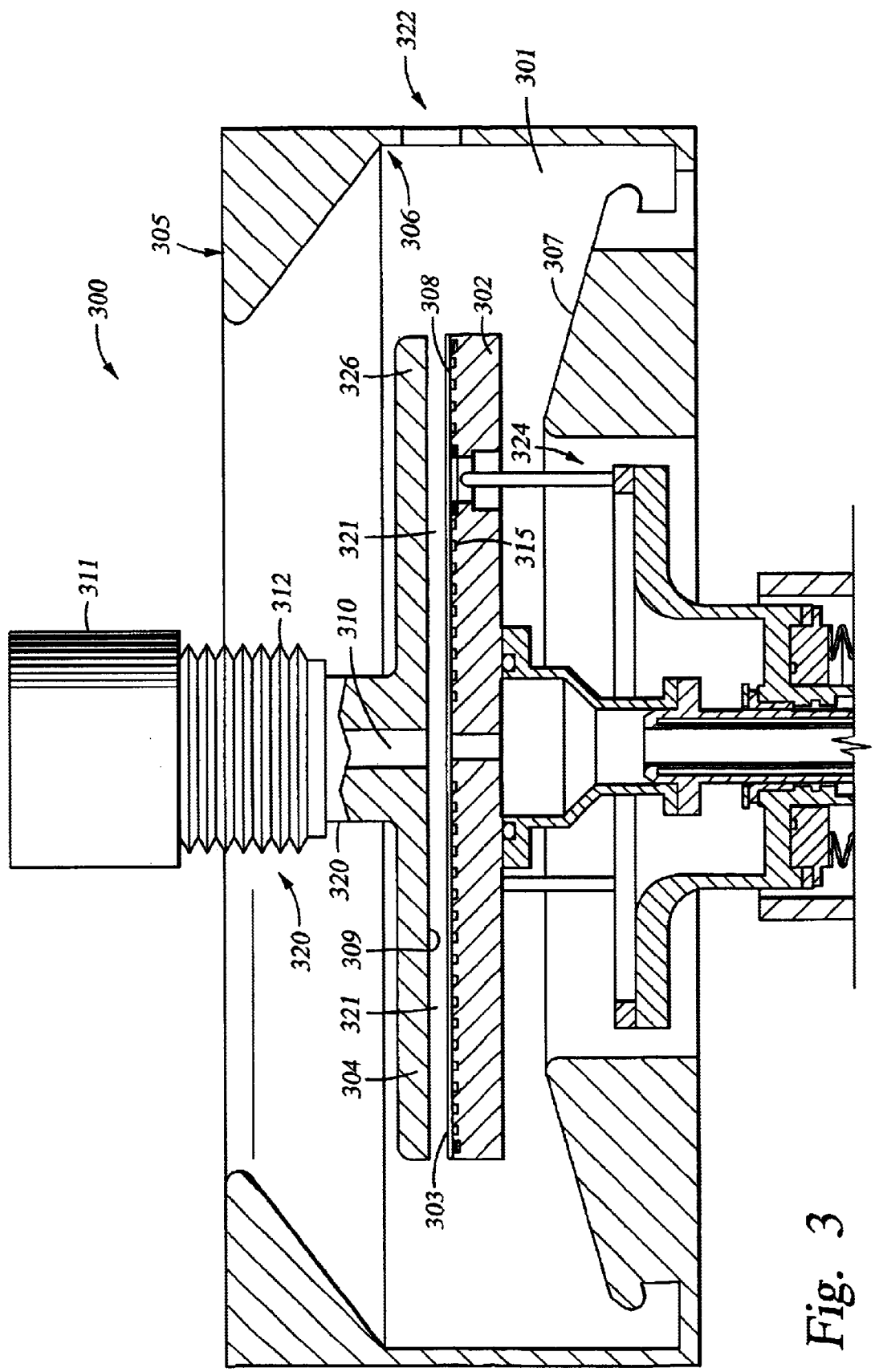
FIG. 3 illustrates a cross sectional view of an exemplary plating cell of the invention.

FIG. 3 illustrates one embodiment of the invention wherein processing chamber 300 is set up as an SRD chamber. SRD chamber 300, which may be an SRD enclosure, station, or other configuration known in the semiconductor art, generally includes an interior region 301 cooperatively defined by a chamber top 305, a chamber bottom 307, and a chamber sidewall 306. Chamber sidewall 306 may include an opening 322, i.e., a slit valve or other selectively closable pass through type opening, formed therein, wherein the opening 322 is configured to communicate substrates into and out of interior region 301 through sidewall 306. Bottom 307 generally includes an annular tapered or sloped surface configured to direct fluids toward a fluid drain for capture and possible recycle. The interior region 301 of chamber 300 includes a centrally disposed rotatable substrate support member 302 positioned therein. Substrate support member 302, which may be heated through, for example, resistive heating elements 325 positioned in the inner portion thereof, is generally configured to support a substrate 303 on upper surface 308. Substrate support member 302 may be manufactured from a plastic material, ceramic materials, aluminum, stainless steel, or other materials suitable for use in semiconductor processing environments. Additionally, the outer surface of substrate support member 302 may be coated with a non-reactive material to prevent reaction with rinsing fluids, processing fluids, or gases that may be used in a semiconductor processing process. Upper surface 308 may include a plurality of vacuum channels 315 formed therein, the channels 315 being in communication with a vacuum source (not shown) for vacuum chucking substrate 303 to upper surface 308. A lift pin assembly 324 may be provided for lifting substrate 303 from upper surface 308 in order to facilitate loading and unloading of substrates from surface 308. Although lift pin assembly 324 is illustrated as passing through the substrate support member 302, the invention is not limited to this configuration. For example, it is contemplated that the outer diameter of the substrate support member 302 may be smaller than the diameter of the substrate, and therefore, the lift pin assembly 324 could be configured to engage the lower surface of the substrate at a position radially outward of the substrate support member 302. Additionally, although the outer diameter of substrate support member 302 is illustrated as being generally the same as the outer diameter of substrate 303 positioned thereon, embodiments of the present invention are not limited to this configuration. For example, it is contemplated within the scope of the present invention to have the diameter of substrate support member 302 to be less than the outer diameter of substrate 303. Similarly, it is contemplated that the outer diameter of substrate support member 302 may be greater than the outer diameter of substrate 203, however, having the outer diameter greater than the substrate diameter generates concerns for the capillary effect, which will be further discussed herein.

Interior region 301 of chamber 300 also includes a rotatably mounted shield member 304 positioned above the upper surface 308 of substrate support member 302. Shield member 304, which may be mounted to chamber top 305 or chamber sidewall 306, for example, includes a lower disk shaped member 326 having a substantially planar and smooth lower surface 309. Lower surface 309 includes a fluid transmission bore 310 formed therein and an upper rotatably mounted shaft or stem member 320 attached to the disk shaped member 326. Lower surface 309 is generally positioned in a substantially parallel orientation with the upper surface 308 of substrate support member 302 when shield member 304 is in processing position. Shield member 304 may be manufactured from a plastic material, silicon carbide, or other suitable non-reactive material, for example. Additionally, shield member 304 may be manufactured from a metal, such as stainless steel or aluminum, and may be coated with a non-reactive coating, such as a plastic material, for example. Shield member 304 is generally configured to be selectively movable between a processing position, i.e., a position where lower surface 309 is positioned proximate upper surface 308 of substrate support member 302, and a substrate loading position, i.e., a position where lower surface 309 is moved a sufficient distance away from upper surface 308 of substrate support member 304 to allow for insertion or removal of substrates from upper surface 308, by a substrate transfer robot, for example. Therefore, shield member 304 may be selectively movable along the longitudinal axis of stem 320 via a selectively extendable assembly 312. In the processing position, for example, the lower surface 309 is generally positioned between 0.5 mm and 10 mm away from the upper surface 308 of substrate support member 302, and in the loading position the shield member 304 may be positioned sufficiently farther from substrate support member 302, such that a substrate may be removed or loaded onto upper surface 308. Alternatively, shield 304 may be mounted to chamber top 305, which may be pivotally mounted to sidewall 306. In this configuration, shield 304 may be pivoted between a processing and loading position simultaneously with the pivotal opening of chamber top 305.

When the shield member 304 is in the processing position, a substrate processing region 321 is defined below the shield 304 and above the substrate support member 302. The substrate processing region 321 generally comprises a volume defined at an upper boundary by the lower surface 309 of shield member 304 and at a lower boundary by the upper substrate receiving surface 208 of substrate support member 302. The outer boundary of processing region 321 is generally defined by the edge of a substrate positioned on substrate support member 302. Additionally, inasmuch as a substrate has thickness, when a substrate is positioned on the substrate support member 302, the lower boundary of the processing region 321 becomes the upper surface of the substrate positioned on the substrate support member 302. Embodiments of the invention provide for the volume of processing region 321 to be minimized, as the distance between the lower surface 309 of shield member 304 and the substrate receiving surface 308 of the substrate support member 302 is reduced to between about 0.5 mm and about 10 mm, for example.

Shield member 304 further includes a fluid channel 310 formed therethrough. Fluid channel 310 generally originates in stem 320 and terminates at the lower surface 309 of shield member 304 proximate the center of shield member 304. Fluid channel 310 is generally in fluid communication with a processing fluid source (not shown), which operates to supply a processing fluid to the substrate processing region 321. The processing fluid may, for example, be an activation solution, a plating solution, a rinsing solution, a cleaning solution, or other fluid solution utilized in semiconductor processing. Shield member 304 also includes a selectively actuated motor 311 in mechanical communication with stem 320. Motor 311 is generally configured to impart rotational motion to stem 320, and therefore, to shield member 304. The rotational motion may be in a clockwise direction, in a counter clockwise, or in alternating directions, for example.

Additionally, the various components of processing system 300 may be in communication with a control system (not shown) configured to receive inputs from system 300 and generate output control systems in response thereto. The control system, which may be a microprocessor based control system similar to control system 122 shown in FIG. 1, for example, may operate to control fluid flow to fluid channel 310, rotation of shield member 304, rotation of substrate support member 302, temperature of substrate support member 302 and/or shield member 304, the vacuum in chamber 301, the negative pressure applied to apertures 315, the longitudinal extension of shield member 304 via selectively extendable assembly 312, gas flow rates and/or other semiconductor plating process parameters. Therefore, generally, the control system may be configured to store a semiconductor processing recipe and generate control signals corresponding to the stored recipe.

In operation, chamber 300, which may be an SRD chamber, may receive a substrate 303 therein via extension of a substrate transfer robot, i.e., substrate transfer robot 128 shown in FIG. 2, into the interior region 301 of chamber 300 via slit valve 322. During the substrate loading process, shield member 304 may be moved into a loading position, which corresponds to a position where the distance between the upper surface 308 of substrate support member 302 and the lower surface 309 of the shield 304 is increased to a distance sufficient to allow robot 128 to access substrate support member 302. With shield 304 in the loading position, the substrate 303 may be placed on lift pin assembly 324 by robot 120. Robot 128 may be retracted from interior region 301 through slit valve 322, which may then be closed to seal interior region 301 from ambient elements. Lift pin assembly 324 may be lowered to position substrate 303 on upper surface 308, and shield 304 may be moved into a processing position, which corresponds to a position where the distance from lower surface 309 of shield 304 to the upper surface 308 of substrate support member 302 is decreased to between about 0.5 mm and about 10 mm, for example. More particularly, the distance may be decreased to between about 0.5 to about 6 mm, for example. A vacuum may be applied to vacuum channels 315 formed into the upper surface 308 of substrate support member 302 in order to vacuum chuck/secure the substrate 303 to upper surface 308 for processing.

Figure 4:
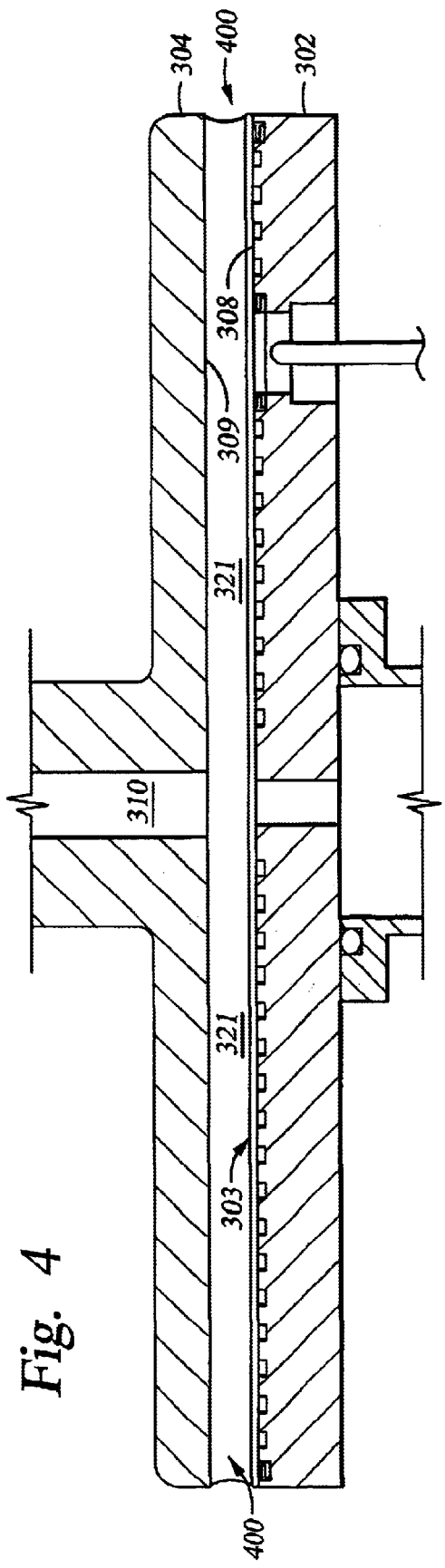
FIG. 4 illustrates a cross sectional view of an exemplary substrate support member and shield member of an embodiment of the invention.
Figure 5:
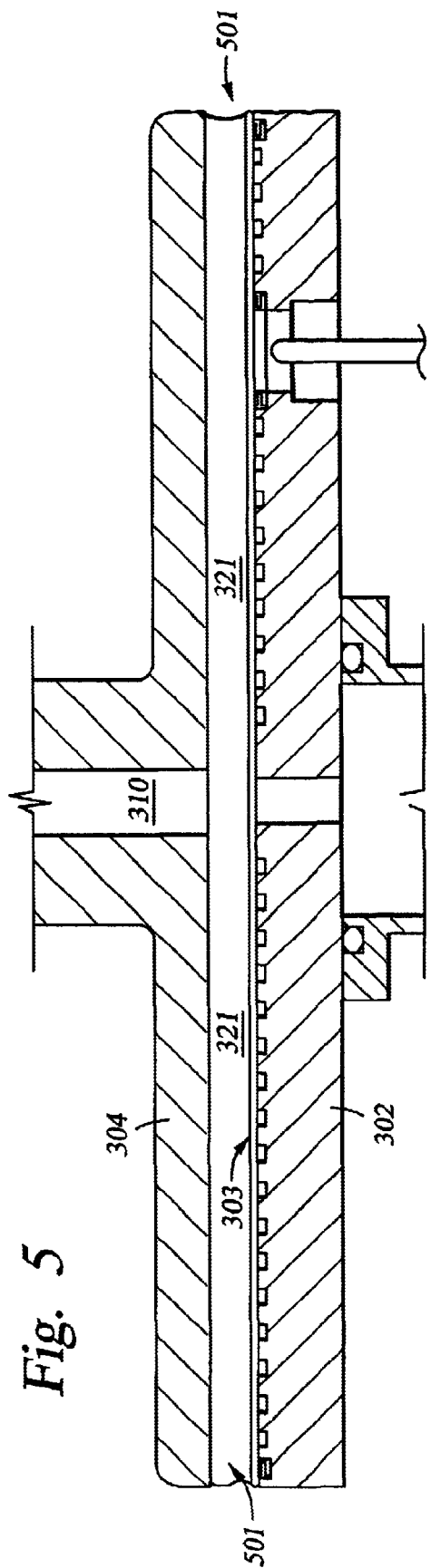
FIG. 5 illustrates another embodiment of a substrate support member and shield member of the invention.

Once substrate 303 is chucked to upper surface 308 and shield 304 is moved into a processing position, a rinsing fluid may be dispensed into substrate processing region 321 via fluid conduit 310. The rinsing fluid may be introduced at a predetermined temperature, i.e., a heating element may be positioned proximate fluid channel 310 in order to heat the rinsing fluid to a predetermined temperature prior to the fluid entering processing region 321. As a result of the close proximity of shield 304 to substrate support member 302, the rinsing fluid operates to fill processing region 321 and form a meniscus 400 proximate the edge of substrate 203, as illustrated in FIG. 4. A meniscus 400 may be concave shaped, convex shaped, or s-shaped, for example, depending upon the resiliency characteristics of substrate support member 302 and shield member 304 to the rinsing fluid. For example, if both substrate support member 302 and shield member 304 are manufactured and/or coated with a hydrophilic material, assuming that the rinsing solution is a water based solution, i.e., deionized water, then meniscus 400 would generally be concave shaped, as illustrated in FIG. 4. Alternatively, if both substrate support member 302 and shield member 304 are manufactured and/or coated with a hydrophobic material, then the fluid meniscus would resemble the convex meniscus 500 shown in FIG. 5. Further still, if substrate support member 302 is manufactured from a hydrophilic material and shield member 304 is manufactured from a hydrophobic material, then the resulting meniscus 501 would be s-shaped, as illustrated in FIG. 5. Regardless of the composition of substrate support member 302 and shield 304, fluid channel 310 supplies the rinsing fluid necessary to fill processing region 321. Once a sufficient volume of rinsing fluid is dispensed into processing region 321, i.e., once an outer fluid meniscus has been formed, then the rinsing fluid delivery via fluid channel 310 may be terminated. The delivery of the predetermined volume of the processing fluid into processing region 321 may be metered by a time dispense operation, a volume dispense operation, a fluid sensor operation, or other operation configured dispense processing fluid into processing region 321. Thus, as a result of meniscus 400, the rinsing fluid delivered to processing region 321 is maintained in region 321 by a meniscal force.

Once processing region 321 is filled with the rinsing fluid, substrate support member 202 and/or shield member 304 may be rotated to circulate the rinsing fluid in processing region 221. For example, substrate support member 302 may be rotated between about 1 RPM and about 60 RPM in order to circulate the rinsing fluid in processing region 321. Alternatively, substrate support member 302 may be rotated in a first direction at a rate of between about 1 RPM and about 60 RPMs, while shield member 304 is simultaneously rotated in a second direction and a rate of between about 1 RPM and about 60 RPM. The counter rotation of substrate support member 302 and shield member 304 may operate to cause a fluid turbulence effect in the rinsing fluid contained in processing region 321, which may offer increased rinsing effectiveness. Another alternative would be to rotate substrate support member 302 in a first direction, while rotating shield member 304 in a second direction during a first time period, and then reversing the rotation of substrate support member 302 to be in the second direction and reversing the rotation of shield member 304 to be in the first direction for a second time period, thus generating an agitating effect in the rinsing fluid, which may also increase rinsing effectiveness. Another advantage of using the counter rotation process of the invention is that the counter rotation generates a pressure differential vertically, i.e., in a direction perpendicular to upper surface 308 and lower surface 309, through the rinsing fluid contained in processing region 321. This vertical pressure differential provides increased fluid circulation, and therefore, provides a more efficient rinsing process.

Regardless of the rotational configuration of substrate support member 302 and shield member 304, the rotational rates of the respective members are generally calculated to maintain fluid meniscus 400. Therefore, the rotation rates of the respective members employed during the rinsing process are generally calculated to generate centrifugal forces in the rinsing fluid that are insufficient to overcome the meniscal force of meniscus 400, which operates to maintain the rinsing fluid in processing region 321. As such, once processing region 321 is initially filled with rinsing fluid for a particular rinsing process, additional rinsing fluid is generally not required. Therefore, embodiments of the present invention provide an apparatus and method for rinsing substrates in a semiconductor processing system, where the apparatus and method uses substantially less rinsing fluid than conventional methods in apparatuses.

Once the rinsing fluid is dispensed into processing region 321 and sufficiently circulated by the rotation of substrate support member 302 and/or shield member 304, then the rinsing process is generally complete. Therefore, once rinsing is complete, then substrate 303 may be spin dried to remove excess rinsing fluid therefrom. The spin dry process generally includes rotating substrate support member 302 at a rotation rate of between about 60 RPM and about 2000 RPM. Regardless of the specific rotation rates, the rotation is generally calculated to be sufficient to urge the rinsing fluid contained in processing region 321 outward over the edge of substrate 303. As such, the rotation rate during the spin dry process is generally calculated to generate a centrifugal force that overcomes the meniscal force of meniscus 400 and allows the rinsing fluid to flow outward over the edge of substrate 303. Additionally, in order to prevent residue rinsing fluid that may be residing on shield member 304 from falling onto substrate 303 during or after the spin dry process, shield member 304 may also be rotated at a rotation rate of between about 60 RPM and about 2000 RPM in order to remove excess rinsing fluid therefrom. Once the rinsing process is complete, fluid channel 310, or another conduit formed into shield member 304, may also be used to introduce a drying gas into processing region 321. The drying gas, which may be clean dry air, nitrogen, are other gas suitable for drying semiconductor substrates, may be introduced under pressure and at a predetermined temperature through fluid channel 310. The drying gas may generally operate to urge any residue rinsing solution outward across the surface of substrate 303, such that the resulting substrate surface is clean, dry, and free of loose particles or residue rinsing solution. Further, the drying gas may be used to facilitate removal of the rinsing solution prior to the drying stage, i.e., the drying gas may be used to urge the rinsing solution out of processing region 321 before or during the spin rinse dry stage.

Once substrate 303 has been rinsed and dried in chamber 300, substrate 303 may be removed therefrom by substrate transfer robot 128, for example. The removal process may include access of substrate transfer robot 128 into chamber 301 via slit valve 322. Robot 128 may engage and remove substrate 303 from chamber 301 through the use of lift pin assembly 324. Thereafter, slit valve 322 may be closed, and robot 128 may deliver substrate 303 to the next processing chamber in system 100.

In another embodiment of the invention, chamber 300 may be configured as an electroless plating chamber. In this embodiment, the physical structure of chamber 300 generally remains unchanged from the previously illustrated SRD chamber. However, in order to implement chamber 300 in an electroless plating configuration, fluid channel 310 may be in fluid communication with a chemical cabinet, wherein the chemical cabinet contains the various chemical solutions required to generate an electroless plating solution, i.e., an activation solution and an electroless electrolyte for electroless plating. In this embodiment, an activated substrate may be positioned on substrate support member 302 and shield member 304 moved into a processing position. Once shield member 304 is in processing position, an electroless plating solution may be flowed into processing region 321 via fluid channel 310. The electroless plating solution may fill the volume of processing region 321 and form a meniscus approximate the edge of the substrate to be plated. Once the meniscus is formed, substrate support member 302 and shield member 304 may be rotated with respect to each other in order to generate a turbulence effect and/or a vertical pressure differential within the electroless plating solution contained within processing region 321. The pressure differential/turbulence effect operates to circulate the electroless plating solution within processing region 321, thereby facilitating efficient use of the electroless plating solution in the plating process.

Additionally, although activation of substrates in electroless processes is generally conducted in a separate chamber, the above noted chemical cabinet may also be configured to generate an electroless activation solution. As such, a substrate may be positioned on substrate support member 302, and activation solution dispensed onto the substrate, and then a plating solution dispensed onto the substrate, such that both activation and electroless plating occurs in a unitary chamber. Furthermore, in the electroless configuration noted above, once the electroless plating solution has been dispensed into processing region 321 and the desired plating accomplished, chamber 300 may also be used as an SRD chamber, as noted above. For example, when the desired quantity of plating is completed, substrate support member 302 and/or shield member 304 may be rotated at a relatively high rate of speed in order to overcome the meniscal force of the electroless plating solution, thus urging the plating solution outward over the edge of the substrate. Thereafter, as noted above, fluid channel 310 may then be used to dispense a rinsing solution onto the surface of the substrate. The rinsing solution may be used to remove any residue electroless plating solution or any residue plating particles that may be on the substrate surface. Thus, it is contemplated within the scope of the present invention that the structure of chamber 300 may be used as a unitary chamber for activation, plating, and spin rinse drying a substrate.

In another embodiment of the invention, chamber 300 may be implemented in electrochemical plating (ECP) configuration. In this configuration, an electrical bias may be applied between the surface of the substrate and an electrolytic plating solution being dispensed thereon. In an ECP plating configuration, the electrical bias will be applied such that the cathode is in electrical communication with the substrate and the anode is in electrical communication with the electrolyte solution. Thus, in ECP configurations, it is contemplated that both fluid channel 310 and/or lower surface 309 of shield member 304 may be manufactured from an electrically conductive material, so that the anode portion of the electrical bias may be communicated to the electrolyte dispensed into processing region 321. In similar fashion to the exemplary electroless plating configuration discussed above, implementation of chamber 300 as an ECP plating chamber may also utilize the advantages provided by chamber 300, i.e., the ECP plating chamber may be configured as a unitary apparatus to both plate and rinse a substrate in an ECP process.

Therefore, embodiments of the invention generally provide a spin rinse dry chamber configured to rinse and dry a substrate using substantially less rinsing fluid, while providing increased fluid circulation characteristics over the surface of the substrate. The use of less rinsing fluid is provided by the additional shield member position immediately above the substrate support member having a substrate positioned thereon for rinsing. The shield member is in substantially parallel orientation to the substrate support member, and therefore, when the rinsing fluid is introduced into the area between the substrate support member and the shield member, it is maintained therein via a meniscal force. With the fluid maintained in this region, the substrate support member and/or the shield member may be selectively rotated in order to generate a turbulence effect in the rinsing fluid. This turbulence effect provides increased circulation of the rinsing fluid and a vertical pressure differential therethrough, which facilitates an increased rinsing efficiency without the need for increasing the volume of rinsing fluid applied to the substrate. Further, the structure of the SRD chamber may be used to implement an electroless or electrochemical plating configuration.

While the foregoing is directed to embodiments of the present invention, other and further embodiments of the invention may be devised without departing from the basic scope thereof, and the scope thereof is determined by the claims that follow.

What is claimed is:

1. A spin rinse dry chamber, comprising:
   a processing enclosure;
   a rotatable substrate support member disposed in the processing enclosure and having an upper substrate receiving surface formed thereon; and
   a rotatable shield member positioned above the upper substrate receiving surface, the rotatable shield member having a substantially planar lower surface that may be positioned proximate the upper substrate receiving surface in a substantially parallel orientation relative thereto, wherein the rotatable substrate support member and the rotatable shield member cooperatively confine a processing volume between the upper substrate receiving surface and the substantially planar lower surface during substrate processing.

2. The spin rinse dry chamber of claim 1, wherein the rotatable substrate support member further comprises:
   a stem portion in mechanical communication with a motor configured to selectively impart rotational motion thereto; and
   a disk shaped member axially affixed to a distal end of the stem portion, an upper side of the disk shaped member having the upper substrate receiving surface formed thereon.

3. The spin rinse dry chamber of claim 2, wherein the upper substrate receiving surface comprises a substantially planar surface having at least one vacuum channel formed therein, the at least one vacuum channel being in fluid communication with a vacuum source.

4. The spin rinse dry chamber of claim 1, wherein the rotatable shield member further comprises:
   an upper stem portion in mechanical communication with a motor configured to selectively impart rotational motion thereto; and
   a lower disk shaped member affixed to a distal end of the upper stem portion, the lower disk shaped member having the substantially planar lower surface formed thereon.

5. The spin rinse dry chamber of claim 4, wherein the substantially planar lower surface includes a fluid aperture formed therein, wherein the fluid aperture is in fluid communication with a fluid source.

6. The spin rinse dry chamber of claim 1, wherein an outer diameter of the selectively rotatable substrate support member is sized to be approximate an outer diameter of the selectively rotatable shield member.

7. The spin rinse dry chamber of claim 1, wherein a separation distance between the selectively rotatable substrate support member and the selectively rotatable shield member during processing is between about 0.5 mm and about 10 mm.

8. The spin rinse dry chamber of claim 1, wherein a separation distance between the selectively rotatable substrate support member and the selectively rotatable shield member during processing is between about 1 mm and about 6 mm.

9. The spin rinse dry chamber of claim 1, wherein the selectively rotatable substrate support member is configured to be rotated in a clockwise direction and a counter clockwise direction, and where the selectively rotatable shield member is configured to be rotated in a clockwise direction and a counter clockwise direction.

10. The spin rinse dry chamber of claim 1, wherein the processing volume contains a processing fluid maintained within the processing volume by a meniscus formed between the upper substrate receiving surface and the substantially planar lower surface.

11. A spin rinse dry chamber, comprising:
   a processing enclosure;
   a rotatable substrate support member disposed in the processing enclosure and having a stem portion in mechanical communication with a motor configured to selectively impart rotational motion thereto, and a disk shaped member axially affixed to a distal end of the stem portion, an upper side of the disk shaped member having an upper substrate receiving surface formed thereon, wherein the upper substrate receiving surface comprises a substantially planar surface having at least one vacuum channel formed therein, the at least one vacuum channel being in fluid communication with a vacuum source, and an annular gas channel positioned proximate an outer perimeter of the substantially planar surface, the annular gas channel being in fluid communication with a gas source; and
   a rotatable shield member positioned above the upper substrate receiving surface, the rotatable shield member having a substantially planar lower surface that may be positioned proximate the upper substrate receiving surface in a substantially parallel orientation relative thereto.

12. A spin rinse dry chamber, comprising:
   a processing enclosure;
   a rotatable substrate support member disposed in the processing enclosure and having a stem portion in mechanical communication with a motor configured to selectively impart rotational motion thereto, and a disk shaped member axially affixed to a distal end of the stem portion, an upper side of the disk shaped member having an upper substrate receiving surface formed thereon, wherein the upper substrate receiving surface comprises a substantially planar surface having at least one vacuum channel formed therein, the at least one vacuum channel being in fluid communication with a vacuum source, and an annular drain channel positioned proximate an outer perimeter of the substantially planar surface; and
   a rotatable shield member positioned above the upper substrate receiving surface, the rotatable shield member having a substantially planar lower surface that may be positioned proximate the upper substrate receiving surface in a substantially parallel orientation relative thereto.

13. A semiconductor processing apparatus, comprising:
   a substrate support member having an upper substrate receiving surface formed thereon;
   a rotatable disk shaped shield member positioned above the substrate receiving surface, the rotatable disk shaped shield member having a substantially planar lower surface positioned in parallel orientation with the upper substrate receiving surface; and
   a processing volume having a lower boundary defined by the upper substrate receiving surface, an upper boundary defined by the substantially planar lower surface, and a perimeter boundary defined by an annular gap positioned proximate a perimeter to at least one of the substrate receiving surface and the planar lower surface.

14. The semiconductor processing apparatus of claim 13, wherein the rotatable disk shaped shield member further comprises a fluid delivery aperture formed into the substantially planar lower surface, wherein the fluid delivery aperture is configured to deliver a fluid to the processing volume.

15. The semiconductor processing apparatus of claim 14, wherein the fluid delivery aperture is selectively in fluid communication with a fluid source.

16. The semiconductor processing apparatus of claim 13, wherein the rotatable disk shaped shield member is configured to be selectively moved between a substrate processing position and a substrate loading position.

17. The semiconductor processing apparatus of claim 16, wherein the substrate processing position further comprises positioning the substantially planar lower surface between about 0.5 mm and about 10 mm from the upper substrate receiving surface.

18. The semiconductor processing apparatus of claim 16, wherein the substrate processing position further comprises positioning the substantially planar lower surface between about 1 mm and about 5 mm from the upper substrate receiving surface.

19. The semiconductor processing apparatus of claim 13, wherein the substrate support member further comprises a first motor in mechanical communication with the substrate support member, the first motor being configured to selectively impart rotational motion thereto.

20. The semiconductor processing apparatus of claim 13, wherein the rotatable disk shaped shield member further comprises a second motor in mechanical communication with the disk shaped shield member, the second motor being configured to selectively impart rotational motion thereto.

21. The semiconductor processing apparatus of claim 13, wherein the upper substrate receiving surface further comprises at least one vacuum channel formed therein, the at least one vacuum channel being in fluid communication with a vacuum source and configured to vacuum chuck a substrate to the upper substrate receiving surface upon application of a vacuum to the at least one vacuum channel.

22. The spin rinse dry chamber of claim 13, wherein the processing volume contains a processing fluid maintained within the processing volume by a meniscus formed in the annular gap between the upper substrate receiving surface and the substantially planar lower surface.

23. A method for processing a substrate, comprising:
positioning the substrate on a substrate support member;
positioning a rotatable shield member having a substantially planar lower surface in a processing position above the substrate such that the substantially planar lower surface is in parallel orientation with an upper surface of the substrate;
flowing a fulid solution into a processing region defined by the upper surface of the substrate and the substantiallyplanar lower surface via a fluid aperture in the substantially planar lower surface, wherein the fluid solution is confined in the processing region; and
rotating the rotatable shield member while processing the substrate with the fluid.

24. The method of claim 23, wherein positioning the substrate further comprises vacuum chucking the substrate to a substrate receiving surface of the substrate support member.

25. The method of claim 23, wherein positioning the substrate further comprises positioning the rotatable shield member in a substrate loading position prior to loading the substrate onto the substrate support member.

26. The method of claim 23, wherein positioning the rotatable shield member in the processing position further comprises positioning the substantially planar lower surface between about 0.5 mm and about 10 mm away from the upper surface of the substrate, while maintaning parallel orientation between the lower surface of the shield member and the substrate surface.

27. The method of claim 23, wherein positioning the rotatable shield member further comprises positioning the substantially planar lower surface between about 1 mm and about 5 mm away from the upper surface of the substrate, while maintaining parallel orientation between the lower surface of the shield member and the substrate surface.

28. The method of claim 23, wherein flowing a fluid solution into the processing region further comprises flowing a predetermined volume of fluid into the processing region, wherein the predetermined volume of a fluid is calculated to fill the processing region and form a meniscus between an edge of the substrate and the substantially planar lower surface of the shield member.

29. The method of claim 23, wherein flowing a fluid solution into the processing region further comprises filling the processing region with the fluid and forming a meniscus proximate a perimeter of the substrate between the surface of the substrate and the substantially planar lower surface.

30. The method of claim 29, wherein forming the meniscus further comprises forming a fluid meniscus between and outer edge of the substrate and the substantially planar lower surface of the shield member.

31. The method of claim 23, further comprising rotating the substrate support member.

32. The method of claim 31, wherein rotating the substrate report member relative to the shield member while maintaining a fluid meniscus between the upper surface of the substrate and the substantially planar lower surface.

33. The method of claim 32, wherein maintaining the fluid meniscus further comprises controlling a centrifugal force generated by rotating the substrate support member relative to the shield member so that the centrifugal force is less than a meniscal force.

34. The method of claim 31, further comprising rotating the substrate support member in a first direction and rotating the shield member in a second direction.

35. The method of claim 34, further comprising switching rotational direction of the substrate support member to the second direction and switching the rotational direction of the shield member to the first direction.

36. The method of claim 31, further comprising at least one of rotating the substrate support member while maintaining the shield member in a fixed position and rotating the shield member while maintaining the substrate support member in a fixed position.

37. The method of claim 24, further comprising drying the substrate.

38. The method of claim 37, wherein drying the substrate comprises:
removing the fluid from the processing region; and
Rotating the substrate support member to remove residue fluid.

39. The method of claim 38, wherein removing the fluid from the processing region further comprises rotating the substrate support member relative to the rotatable shield member at the rotational rate calculated to generate a centrifugal force that exceeds a meniscal force.

40. The method of claim 38, wherein rotating the substrate support member to remove residue fluid further comprises rotating substrate support member at a rotational rate of between 100 RPMs and about 2000 RPMs.

41. The method of claim 38, further comprising rotating the shield member to remove residue fluid therefrom.

* * * * *

UNITED STATES PATENT AND TRADEMARK OFFICE
CERTIFICATE OF CORRECTION

PATENT NO.     : 6,742,279 B2
DATED          : June 1, 2004
INVENTOR(S)    : Dmitry Lubomirsky and Joseph J. Stevens It is certified that error appears in the above-identified patent and that said Letters Patent is hereby corrected as shown below:

Column 14,
Line 7, change "and" to -- an --;
Line 13, change "report" to -- support --;
Line 48, insert -- about -- after "between".

Signed and Sealed this

Fourth Day of January, 2005

JON W. DUDAS
*Director of the United States Patent and Trademark Office*